United States Patent [19]

Suzuki

[11] Patent Number: 5,757,718
[45] Date of Patent: May 26, 1998

[54] SEMICONDUCTOR MEMORY DEVICE HAVING ADDRESS TRANSITION DETECTION CIRCUIT FOR CONTROLLING SENSE AND LATCH OPERATIONS

[75] Inventor: Kouichi Suzuki, Tokyo, Japan

[73] Assignee: NEC Corporation, Tokyo, Japan

[21] Appl. No.: 806,700

[22] Filed: Feb. 26, 1997

[30] Foreign Application Priority Data

Feb. 28, 1996 [JP] Japan ................................. 8-041144

[51] Int. Cl.$^6$ ........................................ G11C 7/00
[52] U.S. Cl. ........................... 365/233.5; 365/233
[58] Field of Search ...................... 365/233.5, 233, 365/194

[56] References Cited

U.S. PATENT DOCUMENTS

| | | | |
|---|---|---|---|
| 4,800,304 | 1/1989 | Takeuchi | 327/279 |
| 4,803,665 | 2/1989 | Kasa | 365/233.5 |
| 5,295,117 | 3/1994 | Okada | 365/233.5 |
| 5,313,435 | 5/1994 | Kim et al. | 365/233.5 |
| 5,414,659 | 5/1995 | Ito | 365/200 |
| 5,418,479 | 5/1995 | Sambandan | 326/93 |
| 5,457,661 | 10/1995 | Tomita et al. | 365/233.5 |
| 5,493,538 | 2/1996 | Bergman | 365/233.5 |
| 5,566,129 | 10/1996 | Nakashima et al. | 365/233.5 |

FOREIGN PATENT DOCUMENTS 7-122093  5/1995  Japan.

Primary Examiner—David C. Nelms
Assistant Examiner—Hien Nguyen

[57] ABSTRACT

In a semiconductor memory device including: an address buffer for generating an address signal, a memory cell array for generating a first data signal in response to the address signal, a sense amplifier circuit for sensing the first data signal to generate a second data signal in response to a sense activation signal, a data latch circuit for latching the second data signal to generate a third data signal in response to a latch activation signal, an address transition detection circuit for detecting a transition of the address signal to generate an address transition detection signal, and a timing generating unit for generating the sense activation signal and the latch activation signal, the timing generating unit is formed by a plurality of timing generating circuits for prolonging the address transition detection signal by different delay times to generate pulse width signals. The delay times have different characteristics depending upon a power supply voltage. Also, a logic circuit logically adds the pulse width signals to each other to generate a logic signal. A pulse prolonging circuit prolongs the logic signal by a definite time to generate the sense activation signal, and a pulse generating circuit generates the logic signal in response to a termination of the logic signal.

9 Claims, 18 Drawing Sheets

PRIOR ART

5,757,718

SEMICONDUCTOR MEMORY DEVICE HAVING ADDRESS TRANSITION DETECTION CIRCUIT FOR CONTROLLING SENSE AND LATCH OPERATIONS

BACKGROUND OF THE INVENTION

1. Field of the Invention

The present invention relates to a semiconductor memory device such as a dynamic random access memory (DRAM) device having an address transition detection circuit for generating an address transition detection signal to control a sense amplifier circuit and a data latch circuit.

2. Description of the Related Art

Generally, in a prior art semiconductor memory device, an address transition detection circuit for detecting a transition of at least one bit of an address signal is incorporated thereinto, and a sense amplifier circuit and a data latch circuit are controlled by a sense activation signal and a latch activation signal, respectively, which are generated in accordance with an address transition detection signal of the address transition detection circuit.

A timing generating circuit for generating the sense activation signal and the latch activation signal includes a delay circuit formed by a series of delay elements and an AND circuit connected to the output of the address transition detection circuit and the outputs of the delay elements. In this case, the AND circuit generates the sense activation signal, and one of the delay elements generates the latch activation signal. This will be explained later in detail.

Generally, in order to enhance access speed, the memory cell array is divided into a plurality of blocks. However, as the number of blocks of a memory cell array is increased, peripheral circuits such as decoders are increased in size which increases the chip area and reduces the manufacturing yield. Therefore, recently, even when the capacity of devices has been remarkably increased, the increase of the number of blocks in memory cell arrays is suppressed. As a result, the access time is dependent upon a power supply voltage. For example, when the power supply voltage is high, the delay time of the memory cell array is determined by a delay time dependent upon word lines, and when the power supply voltage is low, the delay time of the memory cell array is determined by a delay time dependent upon bit lines.

Thus, only when the power supply voltage is within a certain range, is a stable access operation guaranteed. Otherwise, a stable access operation cannot be expected.

Further, in order to normally operate the device under a wide range of power supply voltage, the operating speed of the device has to be reduced. In addition, it is difficult to guarantee an operational margin for the power supply voltage.

SUMMARY OF THE INVENTION

It is an object of the present invention to guarantee an access operation of a semiconductor memory device incorporating an address transition detection circuit.

Another object is to guarantee a wide range operational margin of the semiconductor memory device for a particular power supply voltage.

According to the present invention, in a semiconductor memory device including an address buffer for generating an address signal, a memory cell array for generating a first data signal in response to the address signal, a sense amplifier circuit for sensing the first data signal to generate a second data signal in response to a sense activation signal, a data latch circuit for latching the second data signal to generate a third data signal in response to a latch activation signal, an address transition detection circuit for detecting a transition of the address signal to generate an address transition detection signal and a timing generating unit generating the sense activation signal and the latch activation signal, the timing generating unit is formed by a plurality of timing generating circuits for prolonging the address transition detection signal by different delay times to generate cirtain pulse width signals. The delay times have different characteristics depending upon a power supply voltage. Also, a logic circuit logically adds the pulse width signals to each other to generate a logic signal. A pulse prolonging circuit prolongs the logic signal by a definite time to generate the sense activation signal, and a pluse generating circuit generates the logic signal in response to a termination of the logic signal.

BRIEF DESCRIPTION OF THE DRAWINGS

The present invention will be more clearly understood form the description as set forth below, with reference to the accompanying drawings, wherein.

DESCRIPTION OF THE PREFERRED EMBODIMENTS

Before the description of the preferred embodiments, a prior art DRAM device will be explained with reference to FIGS. 1, 2, 3A through 3H, 4, 5A through 5H, 6A through 6H, 7A through 7H and 8.

Figure 1:
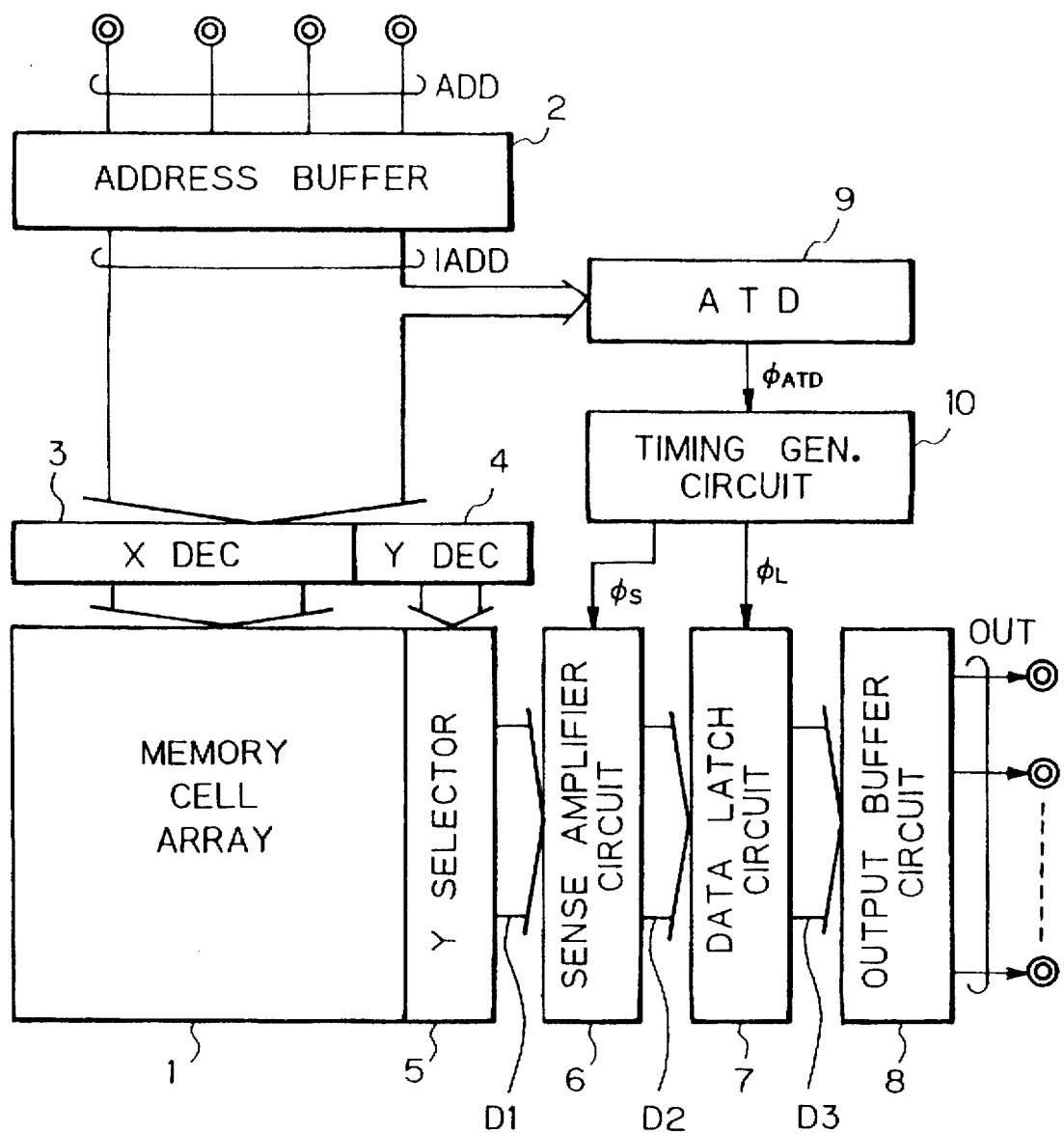
FIG. 1 is a block circuit diagram illustrating a prior art semiconductor memory device.

In FIG. 1, reference numeral 1 designates a memory cell array including memory cells at intersetions of word lines and bit lines (not shown). Also, an address buffer 2 receives an external address signal ADD to generate an internal address signal IADD. An X address component of the internal address signal IADD is supplied to an X decoder 3 for selecting one of the word lines, and a Y address component of the internal address signal IADD is supplied to a Y decoder 4 so that a Y selector 5 selects one (or a pair) or a predetermined number of the bit lines. Thus, one or a predetermined number of the memory cells are selected.

After the bit lines are precharged, data D2 stored in the selected memory cells are sensed by a sense amplifier cirucit 6, so that the sense amplifier circuit 6 generates data D2. The data D2 are latched in a data latch circuit 7, so that the data latch circuit 7 generates an output signal OUT.

The sense amplifier circuit 6 is enabled by a sense activation signal $\phi_S$, and the data latch circuit 7 is enabled by a latch activation signal $\phi_L$.

The sense activation signal $\phi_S$ and the latch activation signal $\phi_L$ are generated by an address transition detection circuit 9 and a timing generating circuit 10.

Figure 2:
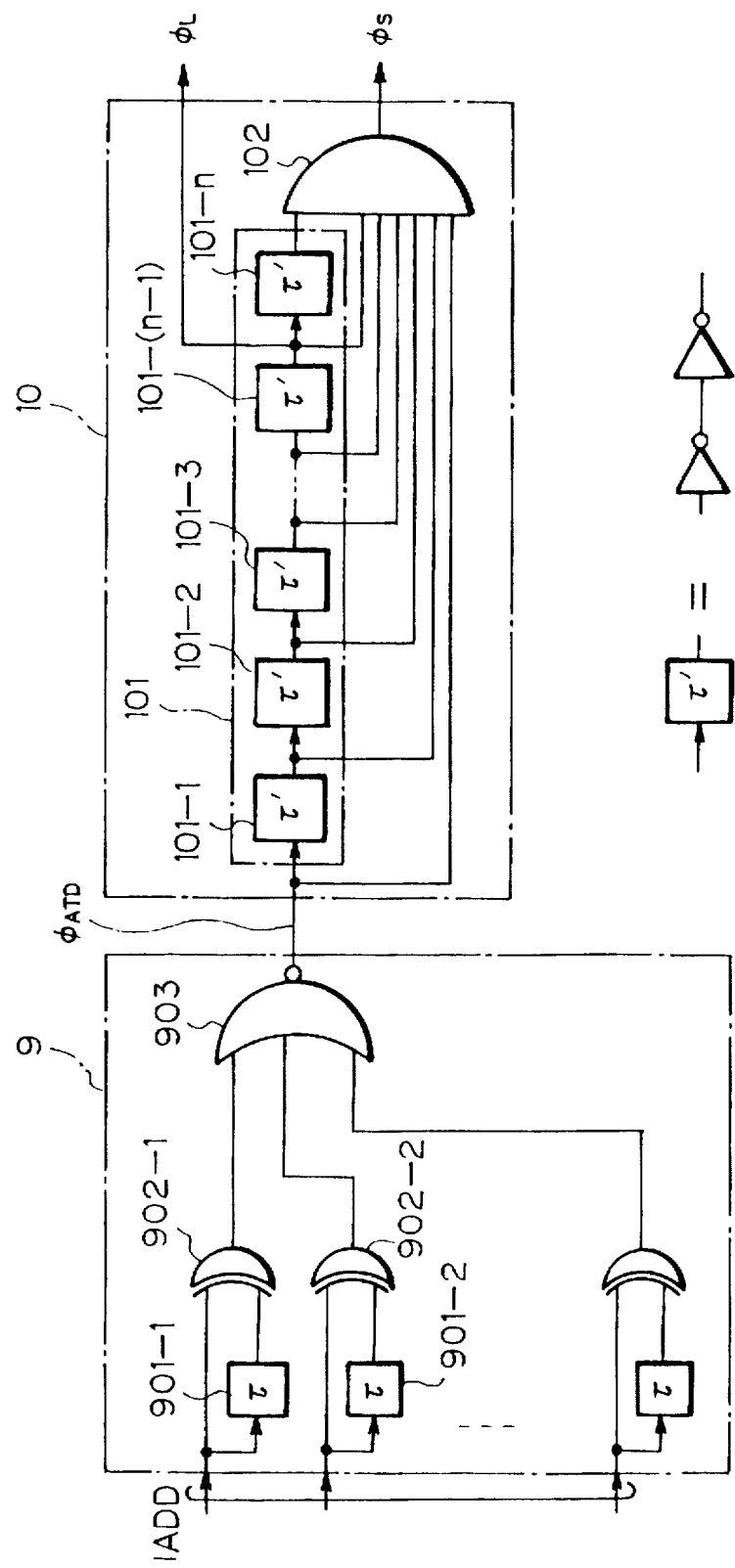
FIG. 2 is a detailed circuit diagram of the address transition detection circuit and the timing generating circuit of FIG. 1.

In FIG. 2, which is a detailed circuit diagram of the address transition detection circuit 9 and the timing generating circuit 10 of FIG. 1, the address transition detection circuit 9 includes a plurality of delay circuits 901-1, 901-2, . . . each corresponding to one bit of the internal address signal IADD, a plurality of exclusive OR circuits 902-1, 902-2, . . . each corresponding to one bit of the internal address signal IADD, and a NOR circuit 903. As a result, if at least one bit of the internal address singal IADD is changed, one of the exclusive OR circuits 902-1, 902-2, . . . generates a pulse signal having a pulse width $\tau$ determined by the delay circuits 901-1, 901-2, . . . . so that the NOR circuit 903 generates an address transition deteciton signal $\phi_{ATD}$ having the time period $\tau$.

Also, the timing generating circuit 10 includes a delay circuit 101 formed by a series of delay elements 101-1, 101-2, . . . , 101-n, and an AND circuit 102 connected to the output of the address transition circuit 9 and the outputs of the delay elements 101-1, 101-2, . . . , 101-n. In this case, the AND circuit 102 generates the sense activation signal $\phi_S$, and the delay element 101-(n-1) generates the latch activation signal $\phi_L$. Note that each of the delay elements 101-1, 101-2, . . . . 101-n is comprised of two inverters connected in series, and a delay time $\tau'$ of each of the delay elements 101-1, 101-2, . . . , 101-n is shorter than $\tau$.

Figure 3:
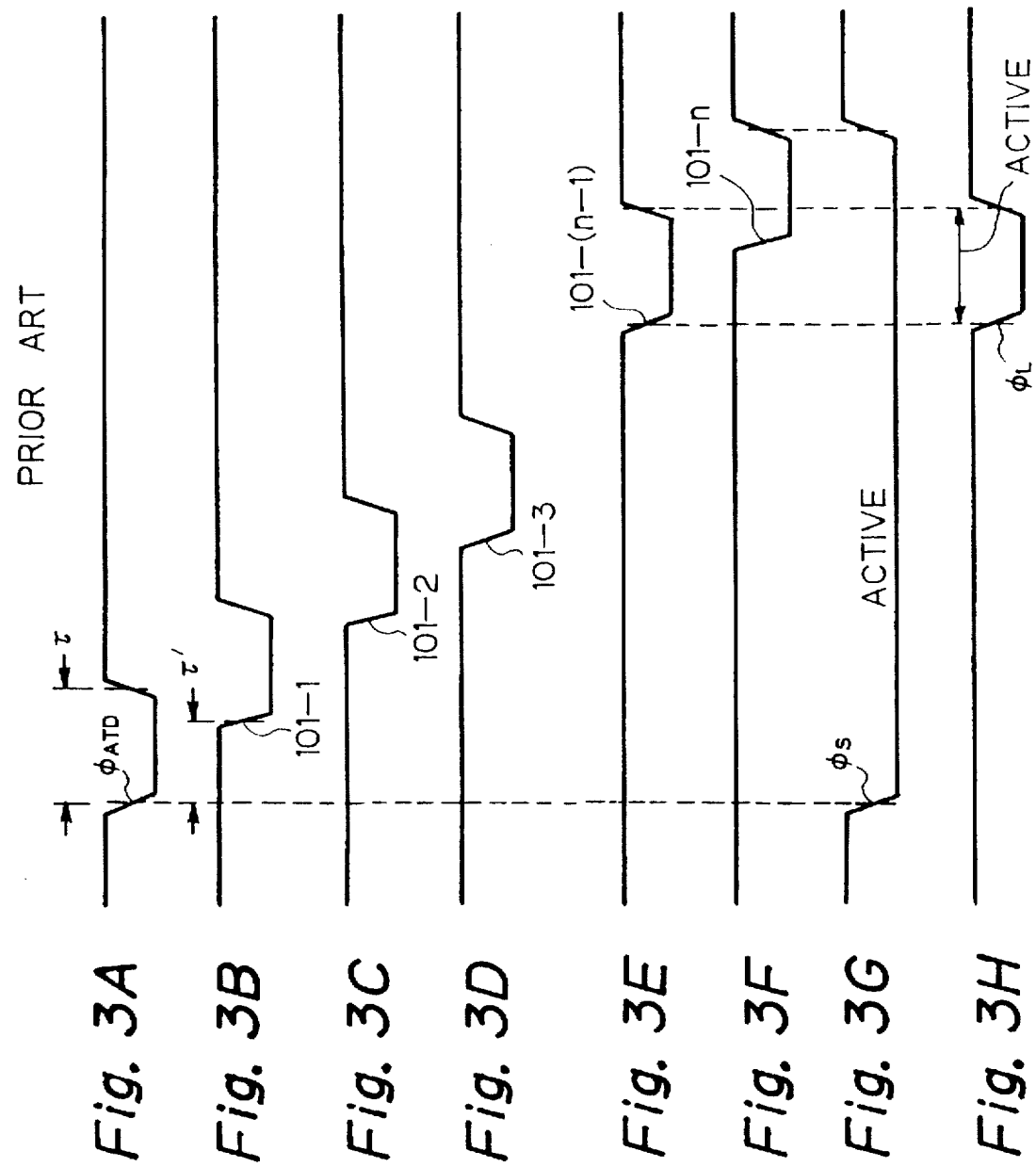
FIGS. 3A through 3H are timing diagrams showing the operation of the timing generating circuit of FIG. 2.

Thus, if the address transition detection signal $\phi_{ATD}$ is changed as shown in FIG. 3A, the outputs of the delay elements 101-1, 101-2, 101-3, . . . , 101-(n-1), 101-n are changed as shown in FIGS. 3B, 3C, 3D, 3E and 3F. As a result, the sense activation signal $\phi_S$ generated from the AND circuit 102 is changed as shown in FIG. 3G. Also, the latch activation signal $\phi_L$ is the same as the output of the delay element 101-(n-1) as shown in FIGS. 3E and 3H.

Figure 4:
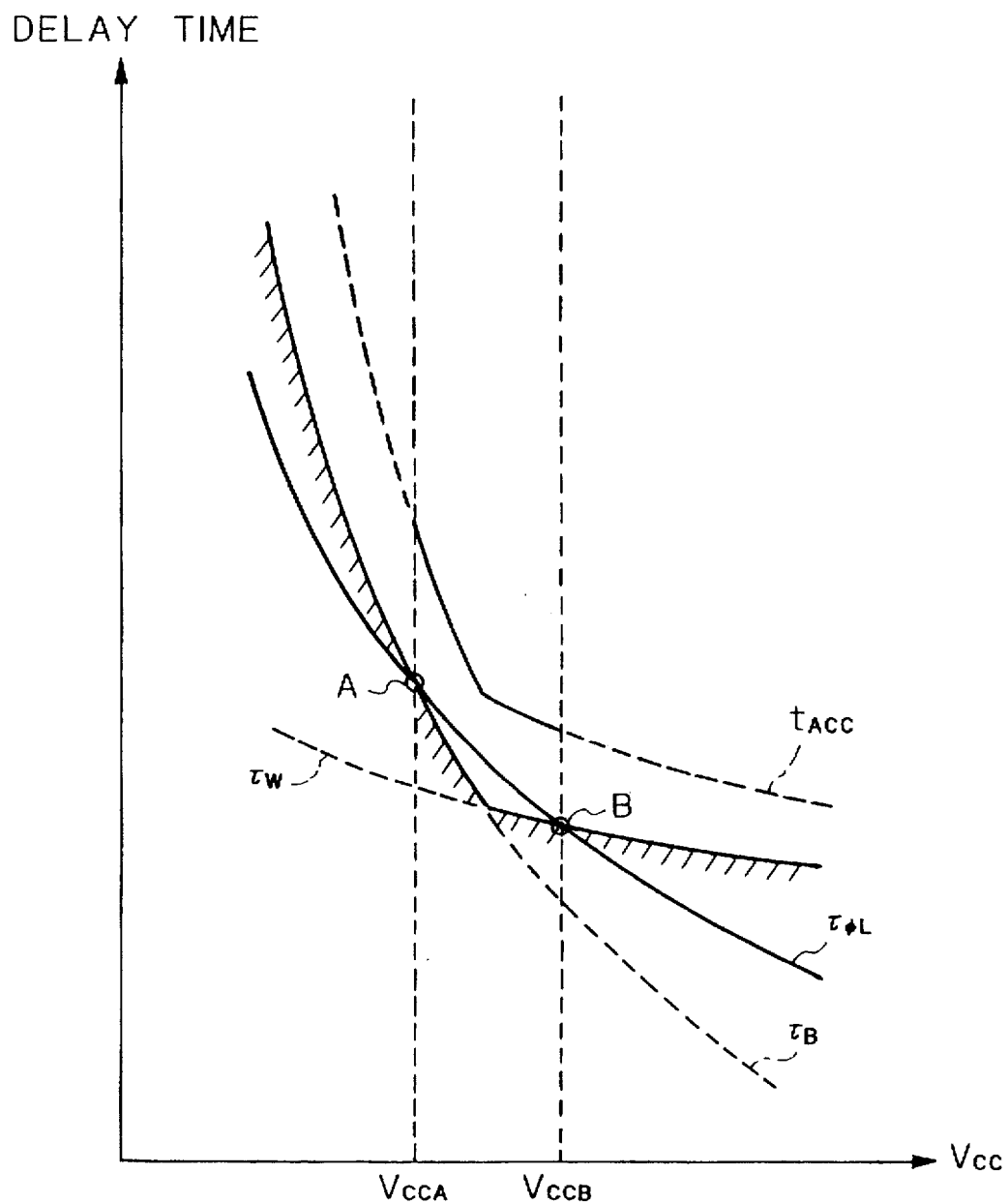
FIG. 4 is a graph showing power supply voltage to delay time characteristics of the device of FIG. 1.
Figure 5:
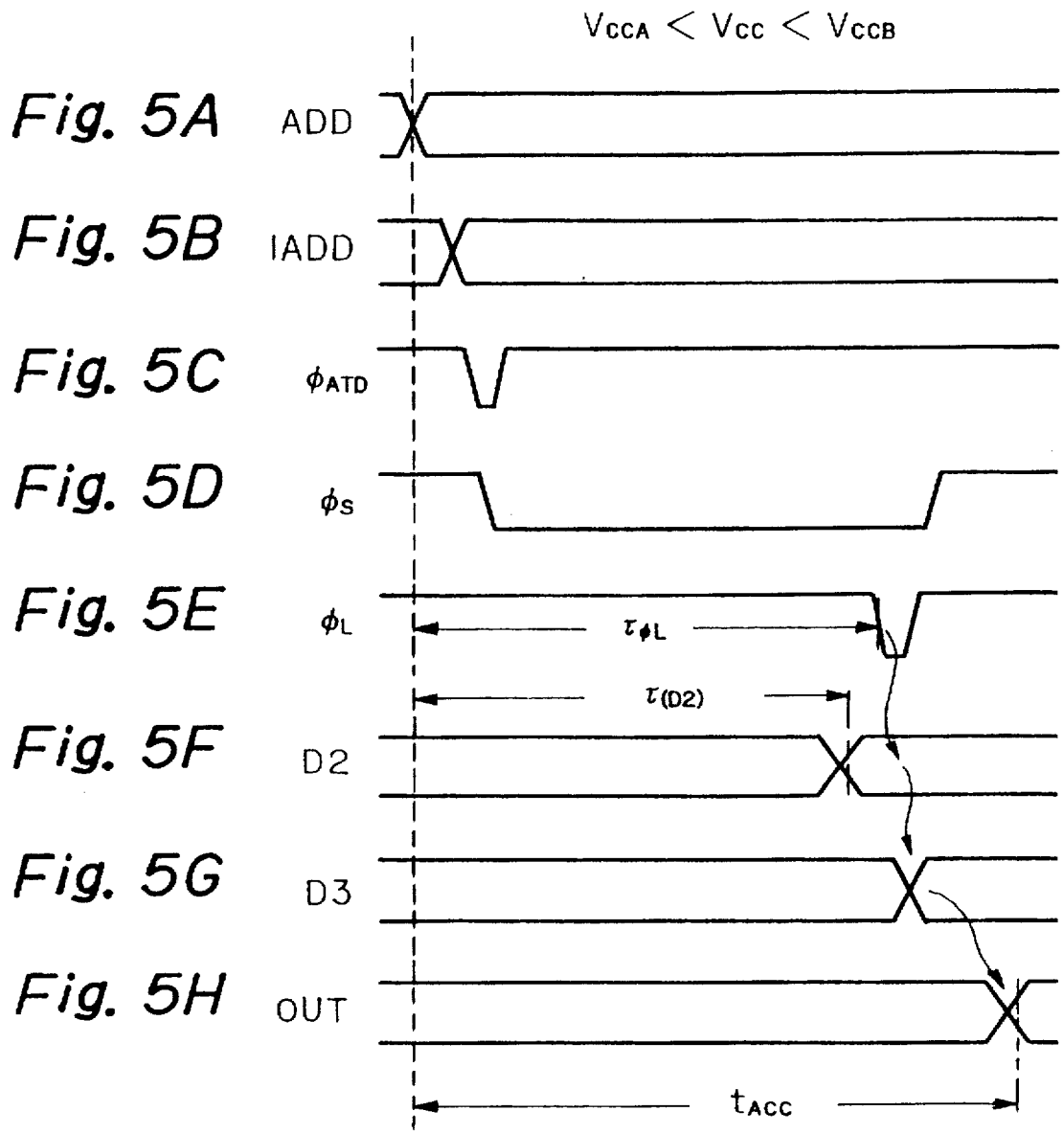
FIGS. 5A through 5H, FIGS. 6A through 6H, and FIGS. 7A through 7H are timing diagrams showing the operation of the device of FIG. 1.
Figure 6:
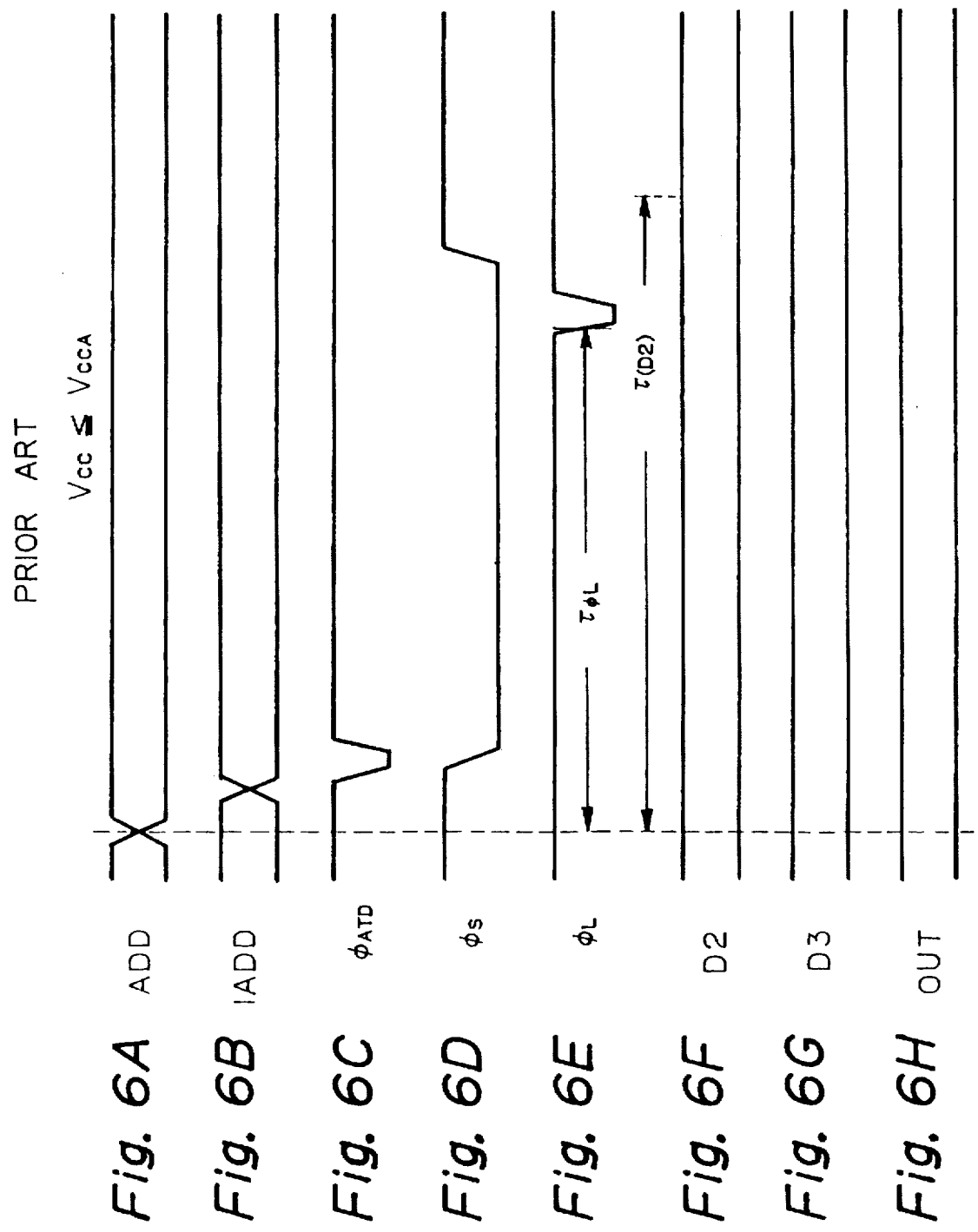
Figure 7:
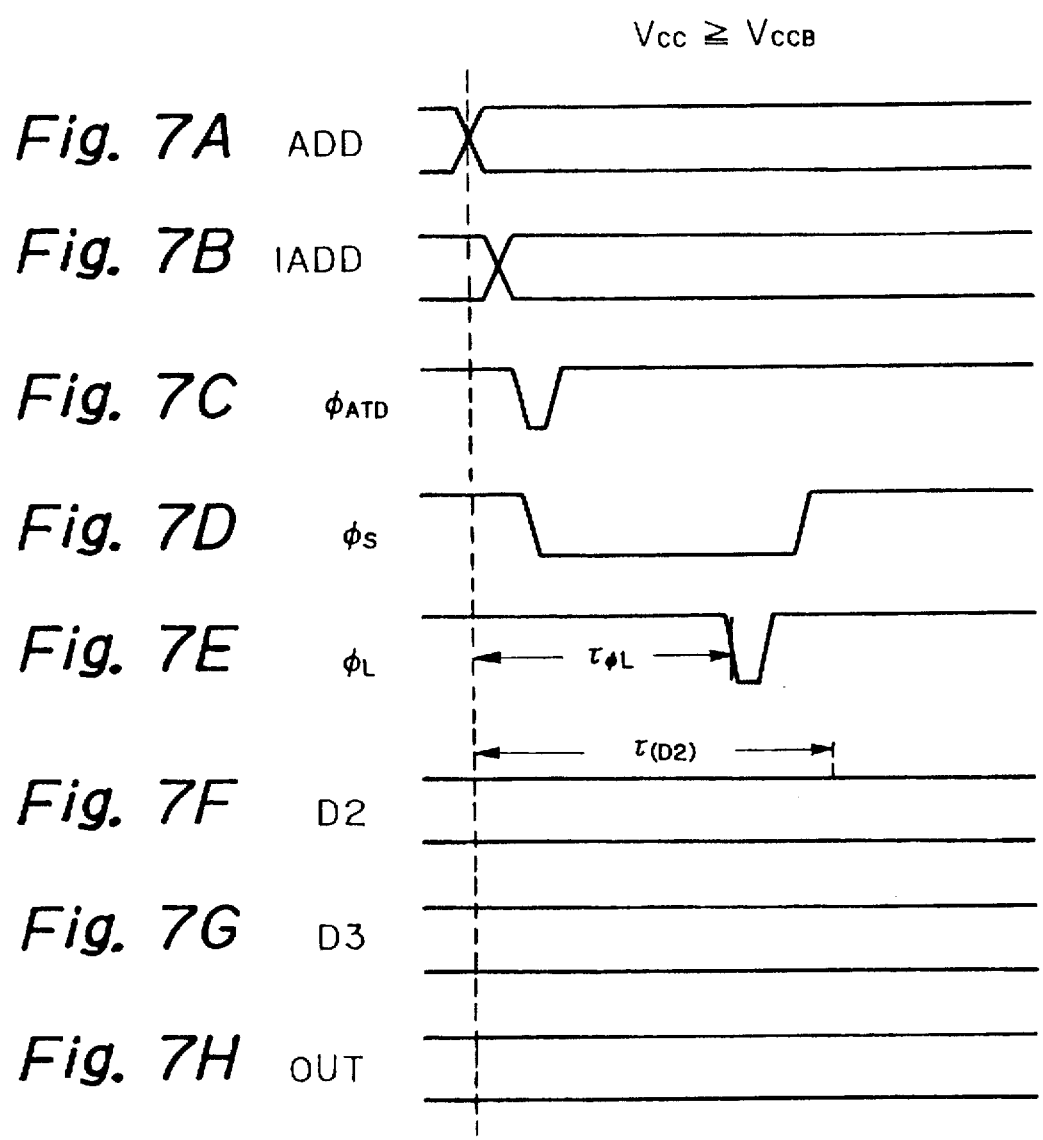

Generally, in order to enhance the access speed, the memory cell array 1 is divided into a plurality of blocks. However, as the number of blocks of the memory cell array 1 is increased, peripheral circuits such as decoders are increased in size which increases the chip area and reduces the manufacturing yield. Therefore, recently, even when the capacity of devices has been remarkably increased, the increase in the number of blocks in memory cell arrays is suppressed. As a result, the access time is dependent upon a power supply voltage $V_{CC}$. For example, a delay time $\tau_W$ depending on the word lines is determined by a time constant CR where C and R are a capacitance and a resistance of one of the word lines, and therefore, is less dependent upon the power supply voltage $V_{CC}$, as shown in FIG. 4. On the other hand, a delay time $\tau_B$ depending on the bit lines is affected by the ability to precharge transistors, and therefore, is more dependent upon the power supply voltage $V_{CC}$, as shown in FIG. 4. Thus, as shown by a shaded discontinuous line in FIG. 4, when the power upply voltage $V_{CC}$ is high, the delay time of the data D2 is determined by the delay time $\tau_W$, and when the power supply voltage $V_{CC}$ is low, the delay time of the data D2 is determined by the delay time $\tau_B$.

Returning to the timing generating circuit 10 of FIG. 2, since the latch activation signal $\phi_L$ is generated through the delay elements 101-1, 101-2, . . . . , 101-(n-1), the delay time $\tau\phi_L$ of the latch activation signal $\phi_L$ is determined by capacitances of the gate capacity and impurity diffusion regions of MOS transistors forming the inverters of the delay elements 101-1, 101-2, . . . . 101-(n-1). Therefore, as shown in FIG. 4, the delay time $\tau\phi_L$ shows a continuous curve with respect to the power supply voltage $V_{CC}$. Since the delay time $\tau$ (D2) of the data D2, i.e., the output of the sense amplifier circuit 6 shows a continuous curve with respect to the power supply voltage $V_{CC}$, the two curves always cross at points A and B as shown in FIG. 4.

Thus, as shown in FIGS. 5A through 5H, only when $V_{CCA} < V_{CC} < V_{CCB}$, is the delay time $\tau\phi_L$ larger than the delay time $\tau$ (D2) of the data D2, which guarantees a stable access operation. In FIG. 4, note that $t_{ACC}$ shows an access time.

Otherwise, a stable access operation cannot be expected. That is, as shown FIGS. 6A through 6H, when $V_{CC} \leq V_{CCA}$, the delay time $\tau\phi_L$ is smaller than the delay time $\tau$ (D2) of the data D2, so that the data latch circuit 7 is operated before the determination of the data D2. Therefore, data latched in the data latch circuit 7 may be incorrect. Similarly, as shown FIGS. 7A through 7H, when $V_{CC} \geq V_{CCB}$, the delay time $\tau\phi_L$ is also smaller than the delay time $\tau$ (D2) of the data D2, so that the data latch circuit 7 is operated before the determination of the data D2. Therefore, data latched in the data latch circuit 7 may be incorrect.

Further, in order to normally operate the device under a wide range of the power supply voltage $V_{CC}$, the operating speed of the device has to be reduced. In addition, the cross-points A and B fluctuate due to the manufacturing process, so that it is difficult to guarantee an operational margin for the power supply voltage $V_{CC}$.

Figure 8:
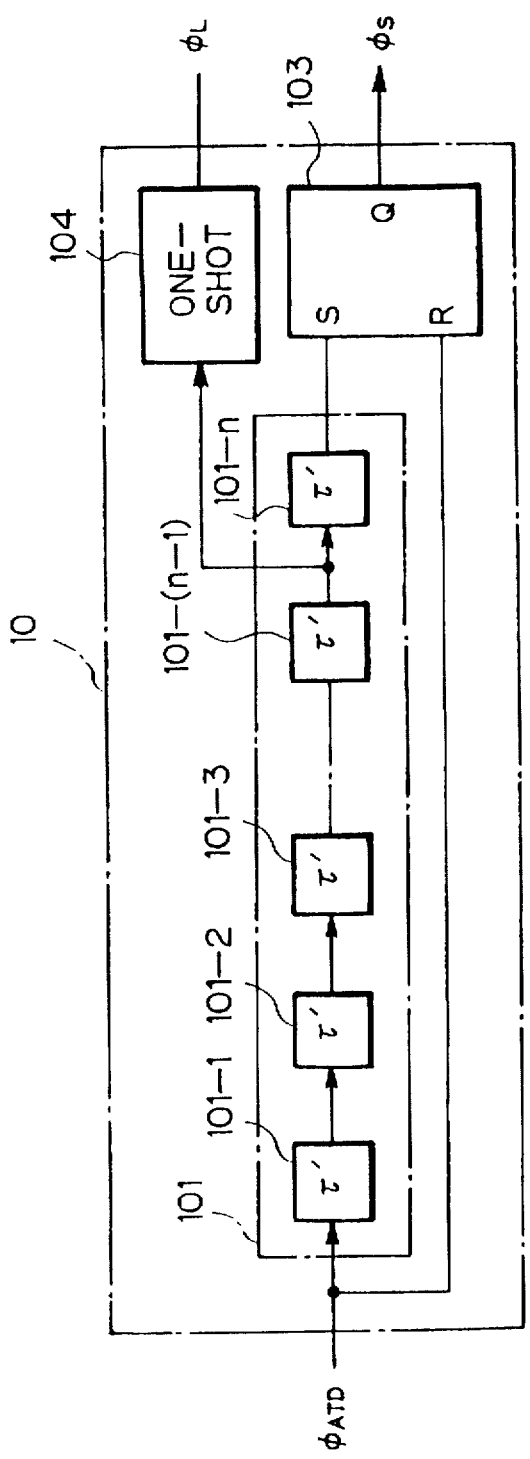
FIG. 8 is a circuit diagram illustrating a modification of the timing generating circuit of FIG. 2.

In FIG. 8, which illustrates a modification of the timing generating circuit 10 of FIG. 2, an RS flip-flop 103 is provided instead of the AND circuit 102, and a one-shot circuit 104 is added to the elements of FIG. 2. The RS flip-flop 103 is reset by a rising or falling edge of the address transition detection signal $\phi_{ATD}$ and is set by a rising or falling edge of the output of the delay circuit 101-n, thus generating the sense activation signal $\phi_S$. Also, the one-shot circuit 104 generates the latch activation signal 100 $_L$.

Figure 9:
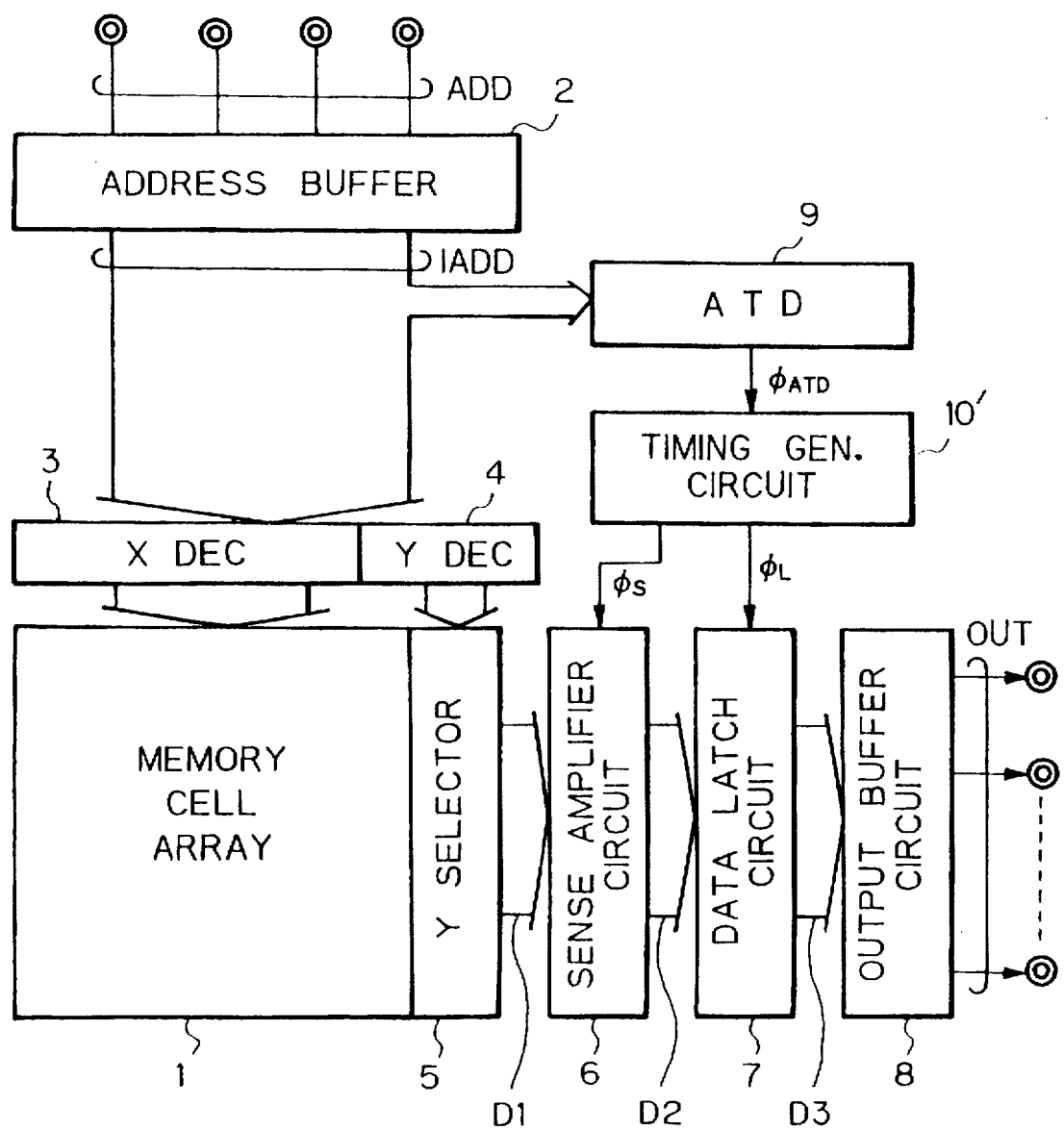
FIG. 9 a block circuit diagram illustrating a first embodiment of the semiconductor memory device.

In FIG. 9, which illustrates a first embodiment of the present invention, a timing generating circuit 10' is provided instead of the timing generating circuit 10 of FIG. 1. The timing generating circuit 10' is illustrated in detail in FIG. 10.

Figure 10:
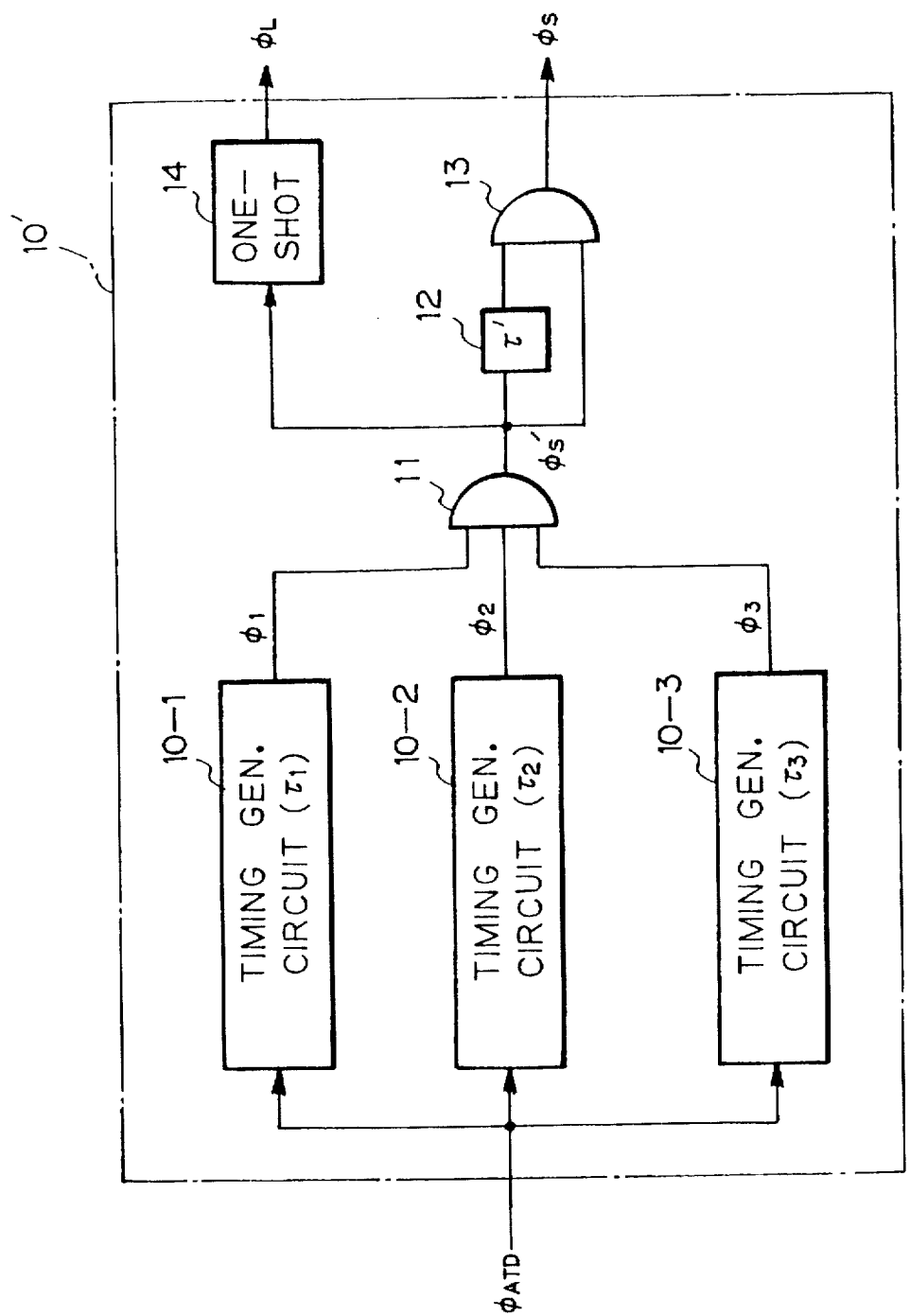
FIG. 10 is a detailed circuit diagram of the timing generating circuit of FIG. 9.

In FIG. 10, timing generating circuits 10-1, 10-2 and 10-3 are provided and are connected to an AND circuit 11. The output signal $\phi_S'$ of the AND circuit 11 is supplied to a delay circuit 12 and an AND circuit 13, thus generating the sense activation signal $\phi_S$. Also, the output signal $\phi_S'$ of the AND circuit 11 is supplied to a one-shot circuit 14, thus generating the latch activation signal $\phi_L$.

Figure 11A:
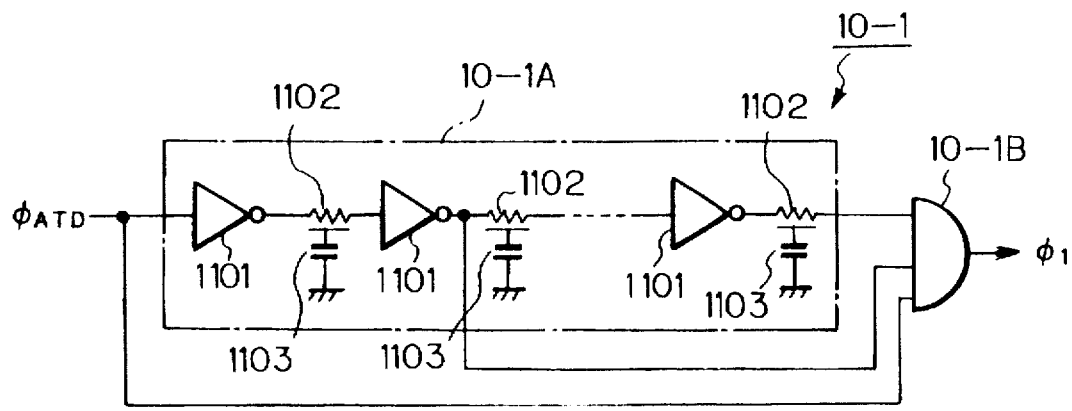
FIGS. 11A, 11B and 11C are detailed circuit diagrams of the timing generating circuits of FIG. 10.
Figure 12:
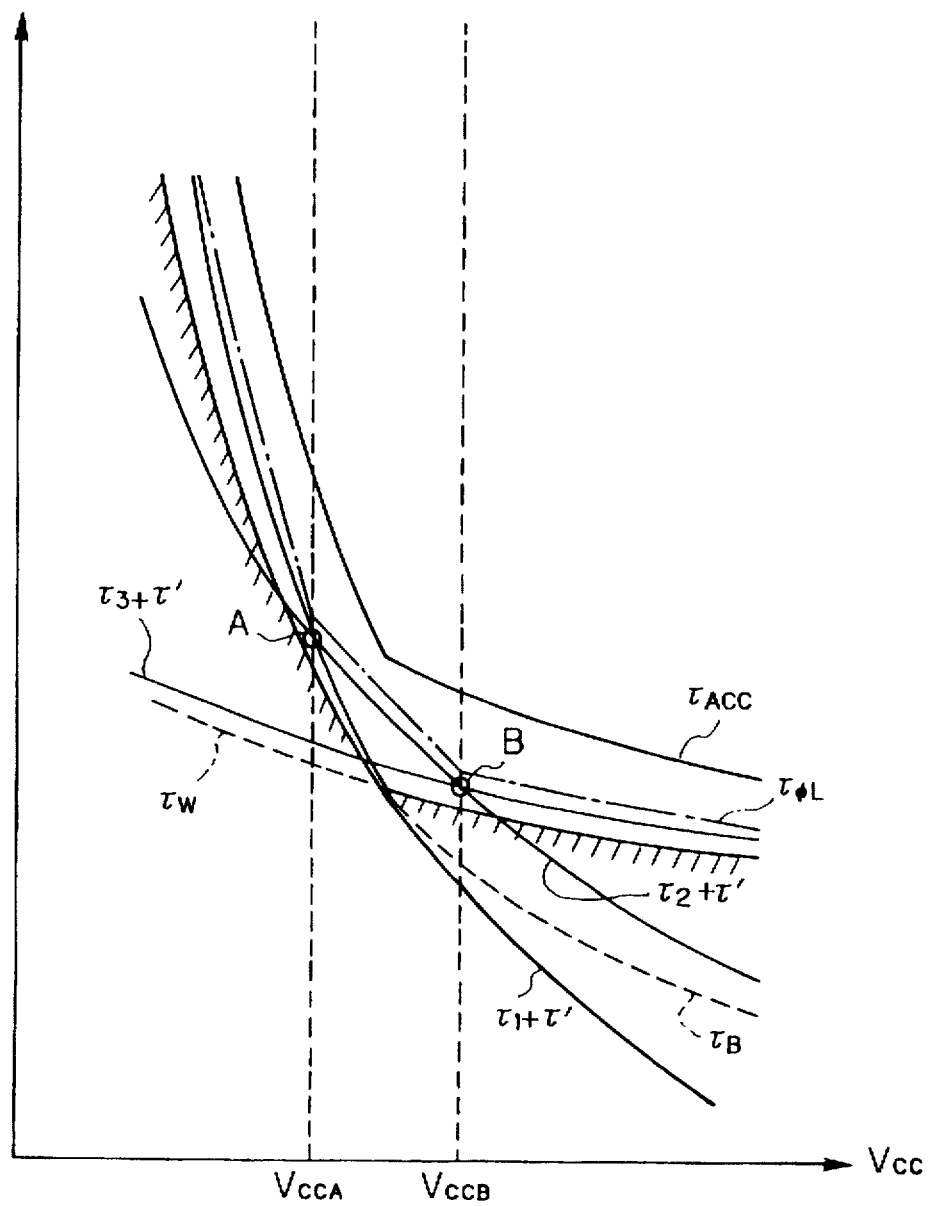
FIG. 12 is a graph showing power supply voltage to delay time characteristics of the device of FIG. 9.
Figure 13:
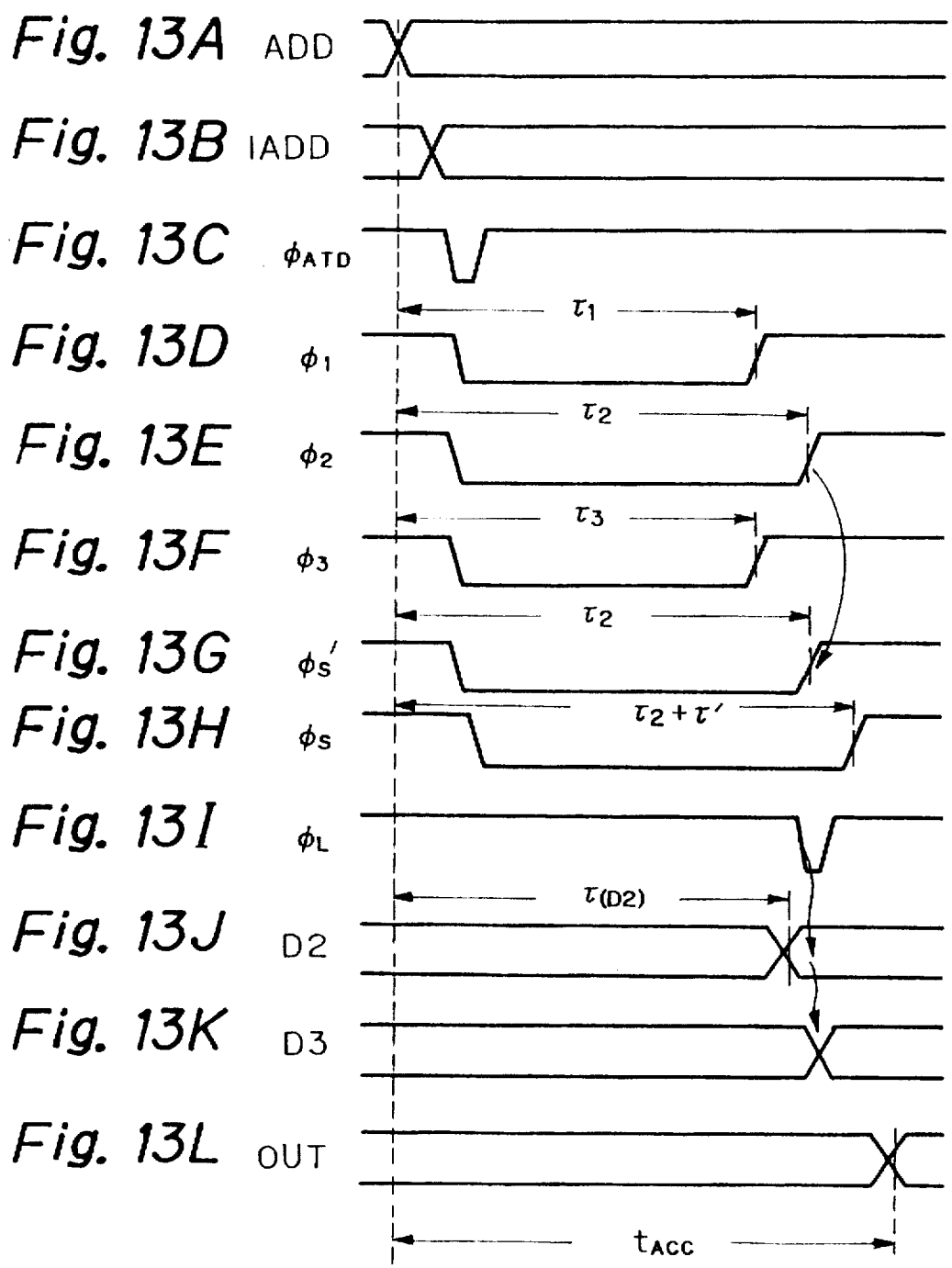
FIGS. 13A through 13L, FIGS. 14A through 14L, and FIGS. 15A through 15L are timing diagrams showing the operation of the device of FIG. 9.
Figure 14:
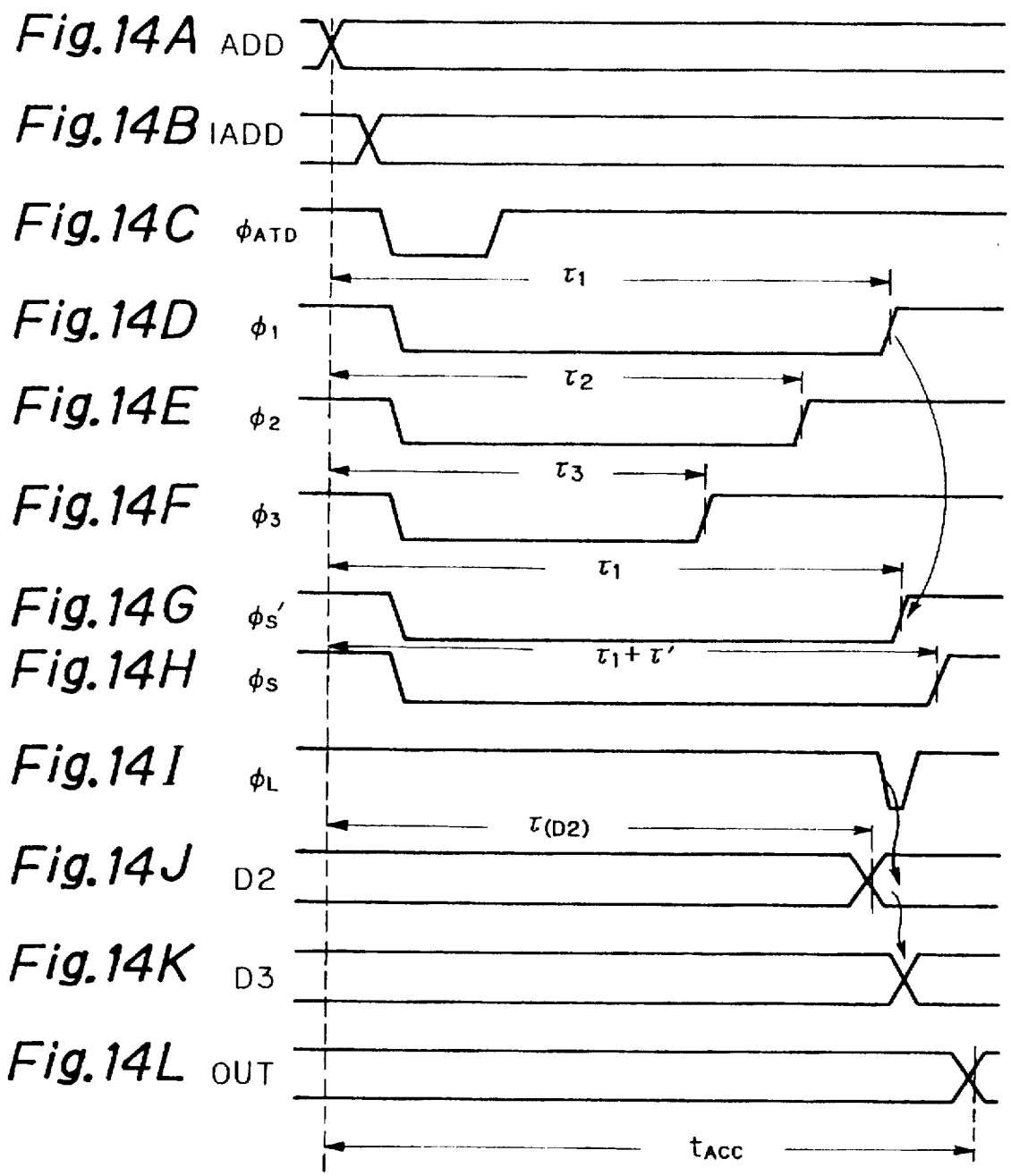
Figure 15:
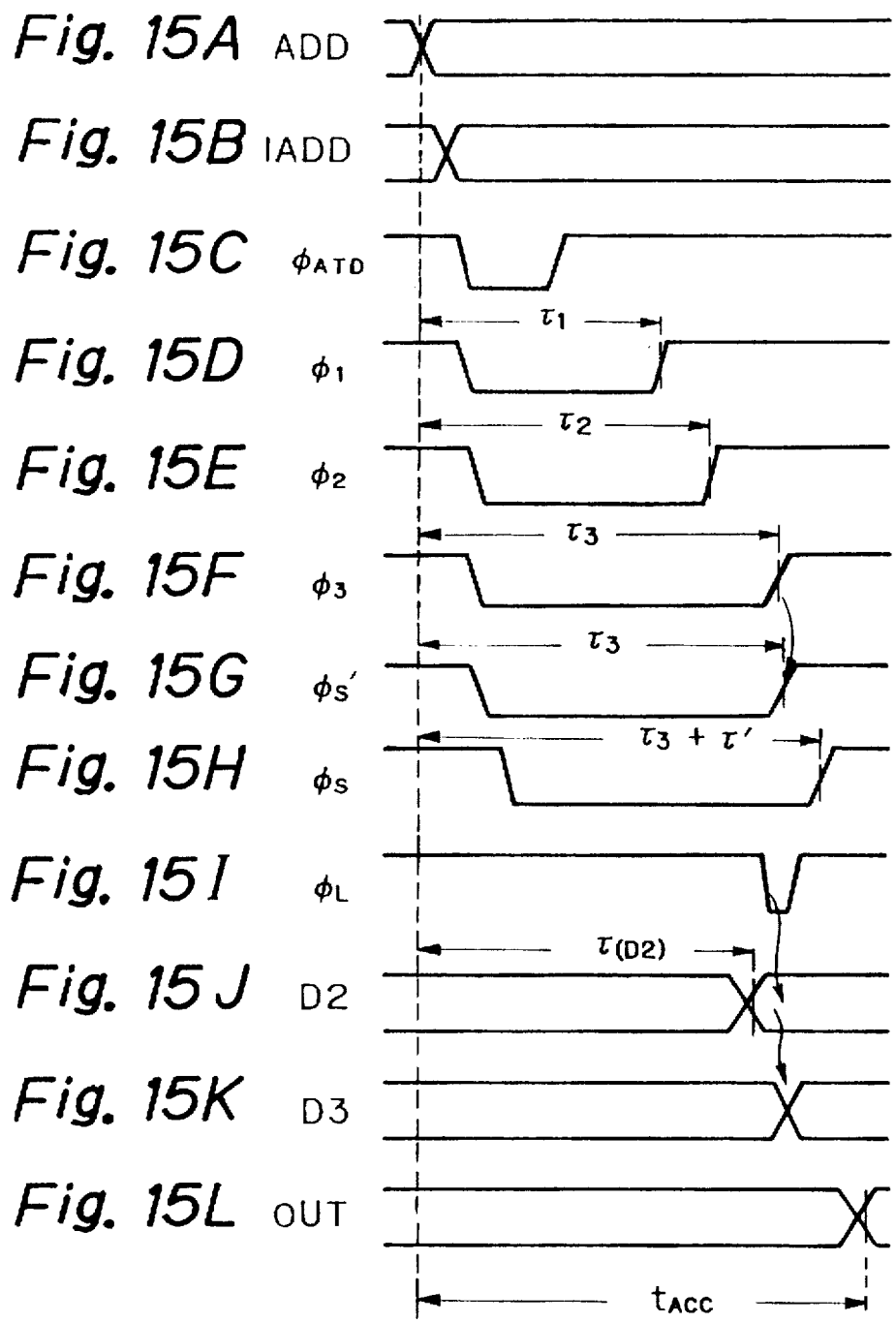

As illustrated in FIG. 11A, the timing generating circuit 10-1 is formed by a delay circuit 10-1A and an AND circuit 10-1B. The delay circuit 10-1A includes a plurality of inverters 1101, a plurality of resistors 1102 and a plurality of capacitors 1103. In this case, the resistance values of the resistors 1102 and the capacitance values of the capacitors 1103 are adjusted so that the delay time $\tau_1$ of the delay circuit 10-1A has greatly sloped characteristics with respect to the power supply voltage $V_{CC}$. That is, as shown in FIG. 12, the delay time $\tau_1+\tau'$ is rapidly changed with respect to the power supply voltage $V_{CC}$, to correspond to the delay time $\tau_B$ depending on the bit lines when the power supply voltage $V_{CC}$ is relatively low ($V_{CC} \leq V_{CCA}$).

Figure 11B:
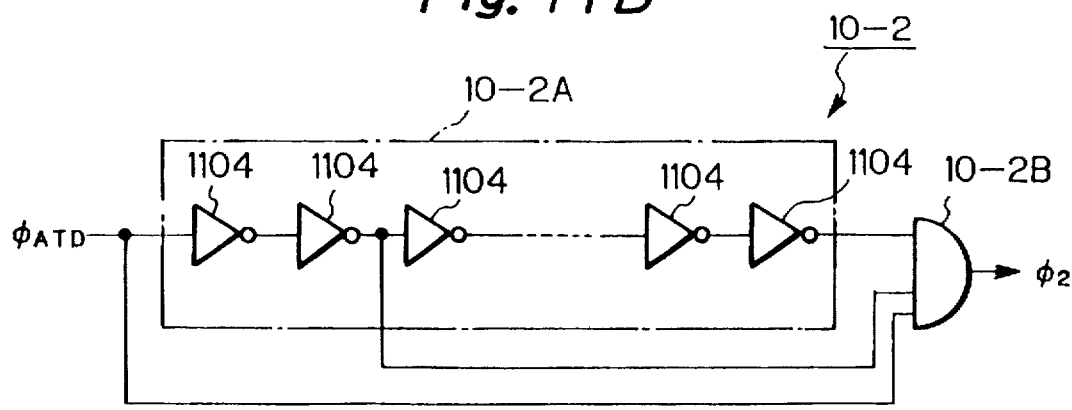

Also, as illustrated in FIG. 11B, the timing generating circuit 10-2 is formed by a delay circuit 10-2A and an AND circuit 10-2B. The delay circuit 10-2A includes a plurality of inverters 1104 connected in series in the same way as in the delay circuit 101 of FIG. 2. In this case, the delay time $\tau_2$ of the delay circuit 10-2A has small sloped characteristics with respect to the power supply voltage $V_{CC}$. That is, as shown in FIG. 12, the delay time $\tau_2+\tau'$ is gradually changed with respect to the power supply voltage $V_{CC}$.

Figure 11C:
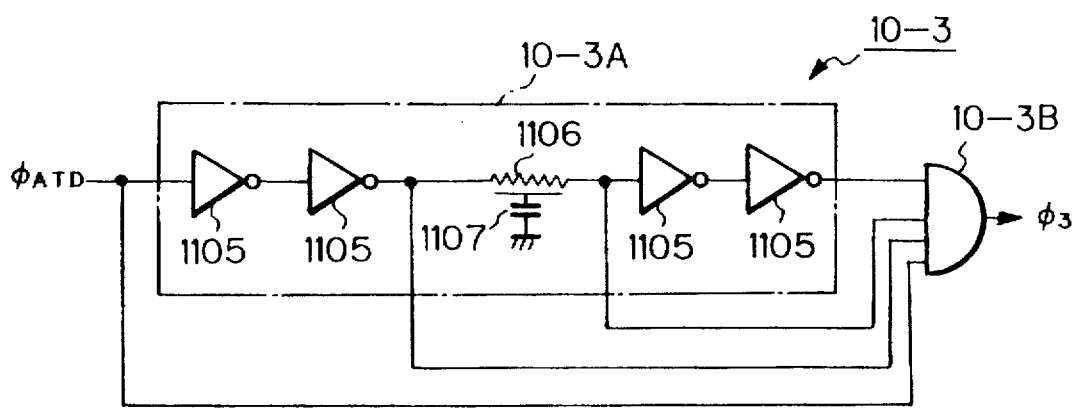

Further, as illustrated in FIG. 11C, the timing generating circuit 10-3 is formed by a delay circuit 10-3A and an AND circuit 10-3B. The delay circuit 10-3A includes a plurality of inverters 1105 serving as wave-shaping means, and a resistor 1106 and a capacitor 1107 therebetween. In this case, the resistance value of the resistor 1106 and the capacitance value of the capacitor 1107 are adjusted so that the delay time $\tau_3$ of the delay circuit 10-3A has almost flat characteristics with respect to the power supply voltage $V_{CC}$. That is, as shown in FIG. 12, the delay time $\tau_3+\tau'$ is almost constant with respect to the power supply voltage $V_{CC}$, to correspond to the delay time $\tau_W$ depending on the word lines when the power supply voltage $V_{CC}$ is relatively high ($V_{CC} \geq V_{CCB}$).

Thus, as shown in FIGS. 13A through 13L, when $V_{CCA}<V_{CC}<V_{CCB}$, the delay time $\tau\phi_L$ is determined by the delay circuit 10-2A of the timing generating circuit 10-2, and is larger than the delay time r (D2) of the data D2, which guarantees a stable access operation.

Also, as shown in FIGS. 14A through 14L, when $V_{CC}<V_{CCA}$, the delay time $\tau\phi_L$ is determined by the delay circuit 10-1A of the timing generating circuit 10-1, and is also larger than the delay time $\tau$ (D2) of the data D2, which guarantees a stable access operation.

Further, as shown in FIGS. 15A through 15L, when $V_{CC} \geq V_{CCB}$, the delay time $\tau\phi_L$ is determined by the delay circuit 10-3A of the timing generating circuit 10-3, and is also larger than the delay time $\tau$ (D2) of the data D2, which guarantees a stable access operation.

Figure 16:
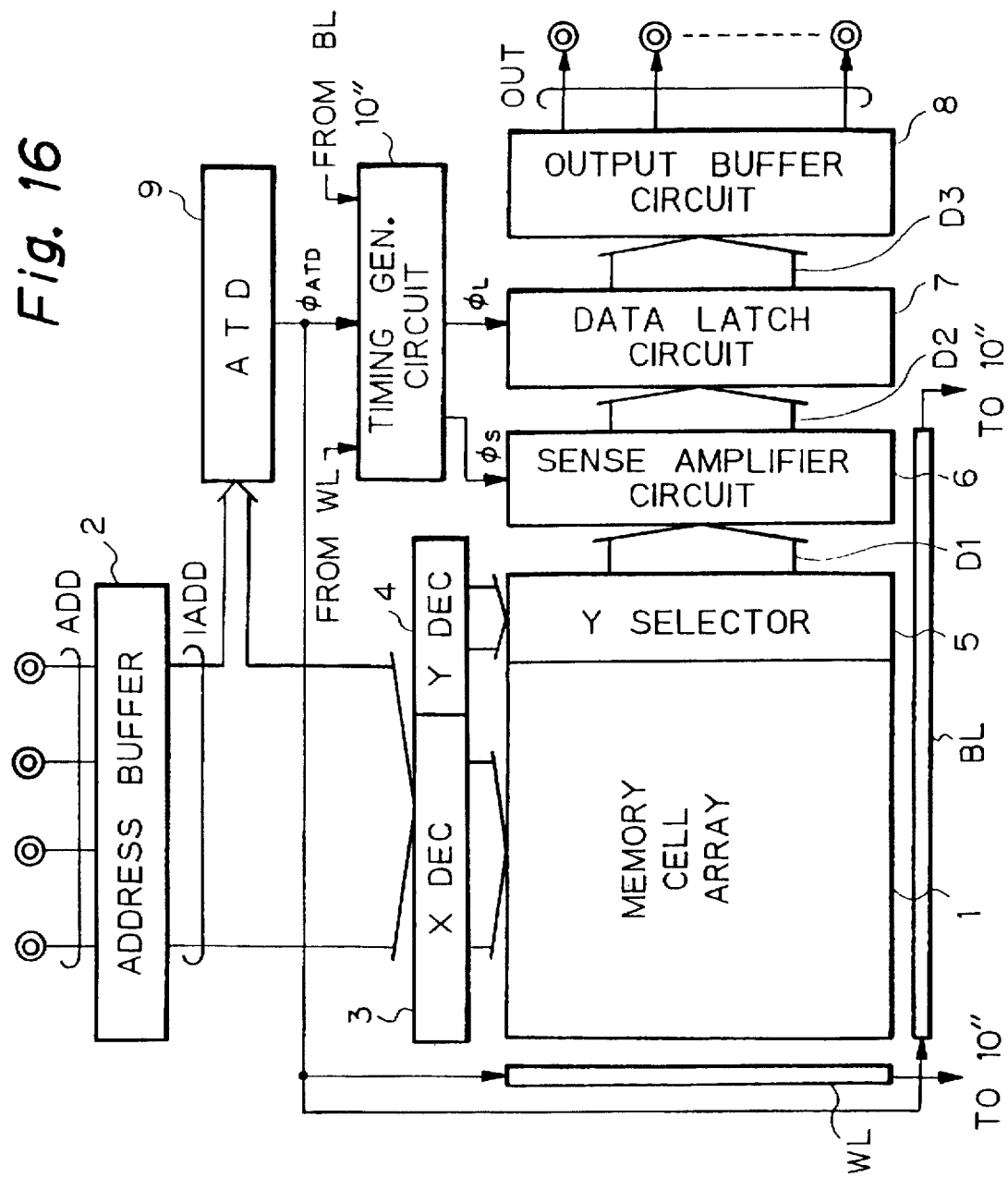
FIG. 16 a block circuit diagram illustrating a second embodiment of the semiconductor memory device.

In FIG. 16, which illustrates a second embodiment of the present invention, a pseudo word line WL and a pseudo bit line BL, which are similar to the word lines and the bit lines, respectively, of the memory cell array 1, are added to the elements of FIG. 9, and the timing generating circuit 10' of FIG. 9 is modified into a timing generating circuit 10".

That is, the address transition detection signal $\phi_{ATD}$ is delayed by the pseudo bit line BL, and then is supplied to the timing generating circuit 10". In this case, the delay time $\tau_1'$ of detection signal $\phi_{ATD}$ corresponds to the delay time $\tau_B$ depending on the bit lines. Also, the address transition detection signal $\phi_{ATD}$ is delayed by the pseudo word line WL, and then is supplied to the timing generating circuit 10". In this case, the delay time $\tau_2'$ of detection signal 100$_{ATD}$ corresponds to the delay time $\tau_W$ depending on the word lines.

Figure 17:
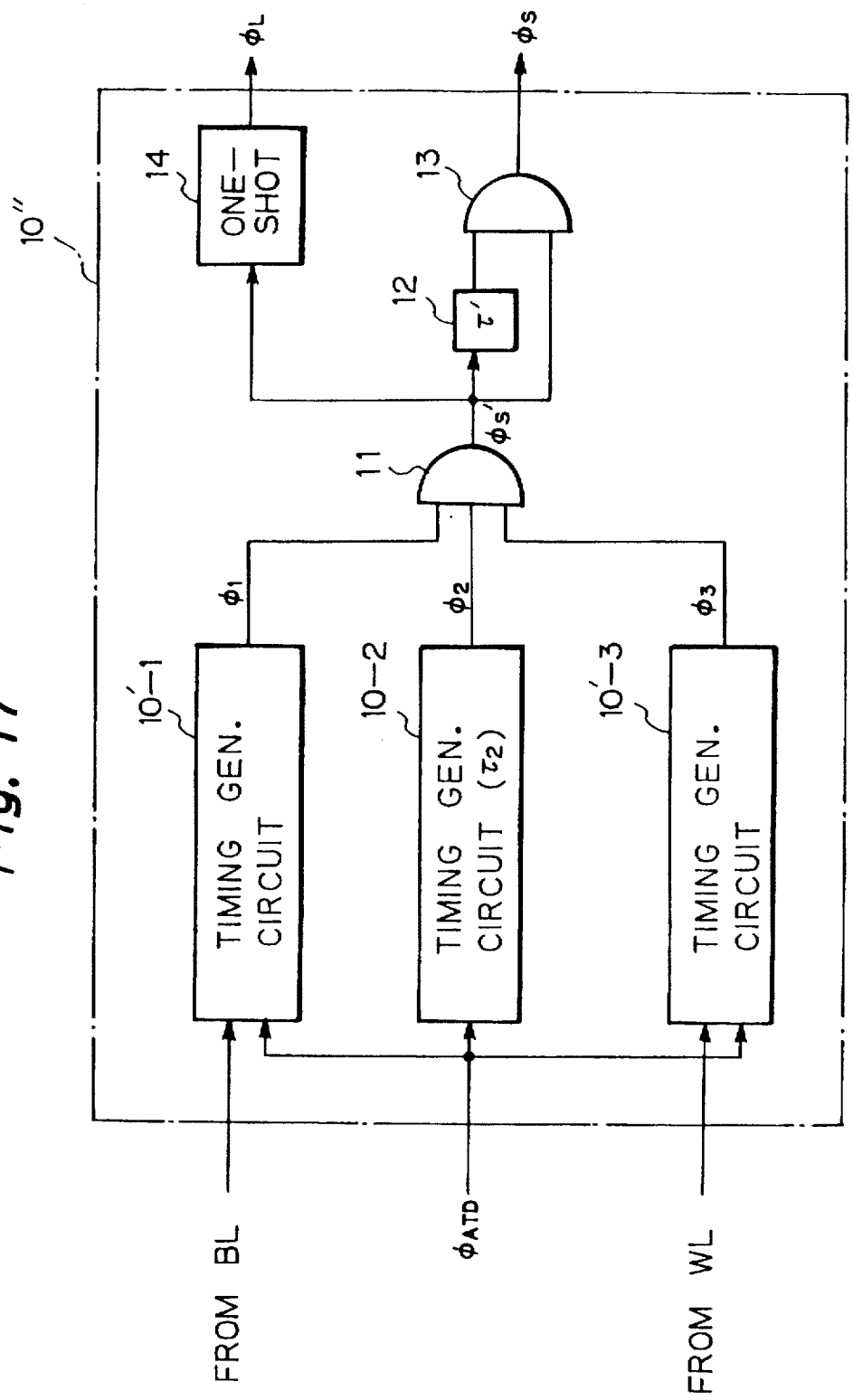
FIG. 17 is a detailed circuit diagram of the timing generating circuit of FIG. 16.

In FIG. 17, which is a detailed circuit diagram of the timing generating circuit 10" of FIG. 16, the timing generating circuits 10'-1 and 10'-3 are different from the timing generating circuits 10-1 and 10-3, respectively, of FIG. 10. That is, since the signals from the pseudo bit line BL and the pseudo word line WL are already delayed thereby, the timing generating circuits 10'-1 and 10'-3 have no delay functions, as illustrated in FIGS. 18A and 18B.

Figure 18A:
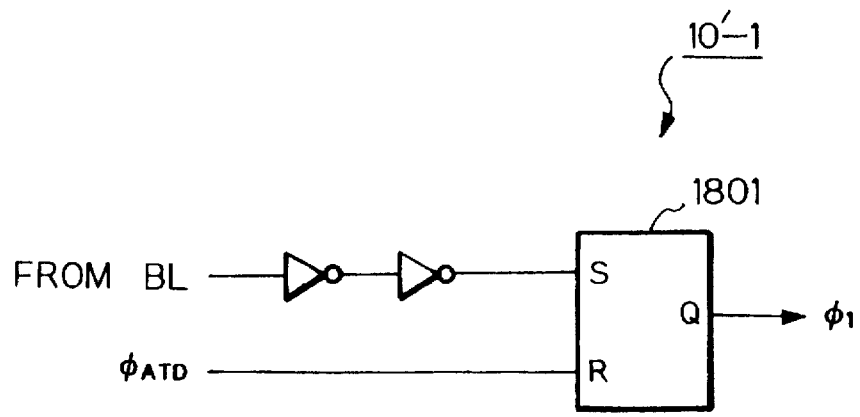
FIGS. 18A and 18B are detailed circuit diagrams of the timing generating circuits of FIG. 17.
Figure 18B:
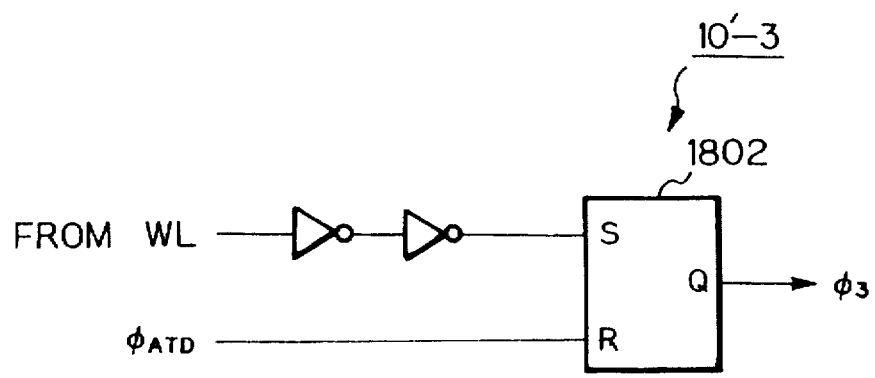

In FIG. 18A, an RS flip-flop 1801 is reset by a rising or falling edge of the address transition detection signal $\phi_{ATD}$ and is set by a rising or falling edge of the signal from the pseudo bit line BL, thus generating the same signal $\phi_1$ as FIG. 11A. Similarly, in FIG. 18B, an RS flip-flop 1802 is reset by a rising or falling edge of the address transition detection signal $\phi_{ATD}$ and is set by a rising or falling edge of the signal from the pseudo word line WL, thus generating the same signal $\phi_2$ as FIG. 11C.

Thus, the device of FIG. 16 operates in the same way as the device of FIG. 9, as shown in FIGS. 13A through 13L, FIGS. 14A through 14L and FIGS. 15A through 15L.

As explained hereinabove, according to the present invention, since the latch timing of the data latch circuit can be optimized for the power supply voltage, an access operation can be normally carried out without reducing the access speed thereof. In addition, a large operational margin can be obtained over a wide range of the power supply voltage.

I claim:

1. A semiconductor memory device comprising:

an address buffer for generating an address signal;

a memory cell array, connected to said address buffer, for generating a first data signal in response to said address signal;

a sense amplifier circuit, connected to said memory cell array, for sensing said first data signal to generate a second data signal in response to a sense activation signal;

a data latch circuit, connected to said sense amplifier circuit, for latching said second data signal to generate a third data signal in response to a latch activation signal;

an address transition detection circuit, connected to said address buffer, for detecting a transition of said address signal to generate an address transition detection signal; and a timing generating means connected to said address transition detection circuit, said sense amplilifier circuit and said data latch circuit, for generating said sense activation signal and said latch activation signal, said timing generating means comprising:

a plurality of timing generating circuits for prolonging said address transition detection signal by different delay times to generate pulse width signals, said delay times having different characteristics depending upon a power supply voltage;

a first logic circuit, connected to said timing generating circuits, for logically adding said pulse width signals to each other to generate a logic signal;

a pulse prolonging circuit, connected to said first logic circuit, for prolonging said logic signal by a definite time to generate said sense activation signal; and a pulse generating circuit, connected to said first logic circuit, for generating said logic signal in response to a termination of said first logic signal.

2. The device as set forth in claim 1, wherein a first one of said delay times corresponds to a first delay time of bit lines included in said memory cell array when said power supply voltage is smaller than a first voltage, a second one of said delay times corresponds to a second delay time of word lines included in said memory cell array when said power supply voltage is larger than a second voltage larger than said first voltage, a third one of said delay times being an intermediate delay time between said first and second delay times.

3. The device as set forth in claim 2, wherein a first one of said timing generating circuits corresponding to said first delay time comprises:

a plurality of inverters arranged in series;

a plurality of RC circuits each connected between said inverters; and a second logic circuit connected to a number of said inverters.

4. The device as set forth in claim 2, wherein a second one of said timing generating circuits corresponding to said second delay time comprises:

two wave-shaping circuits arranged in series;

an RC circuit connected between said inverters; and a third logic circuit connected to inputs and outputs said wave-shaping circuits.

5. The device as set forth in claim 2, wherein a third one of said timing generating circuits corresponding to said second delay time comprises:

a plurality of inverters arranged in series; and a fifth logic circuit connected to a number of said inverters.

6. The device as set forth in claim 2, further comprising:

a pseudo bit line similar to one of said bit lines, connected between said address transition detection circuit and a first one of said timing generating circuits; and a pseudo word line similar to one of said word lines, connected between said address transition detection circuit and a second one of said timing generating circuits.

7. The device as set forth in claim 6, wherein said first one of said timing generating circuits comprises:

a waveshaping circuit connected to said pseudo bit line; and a flip-flop which is reset by one of said address transition detection signals and is set by output of said waveshaping circuit.

8. The device as set forth in claim 6, wherein said second one of said timing generating circuits comprises:

a waveshaping circuit connected to said pseudo bit line; and a flip-flop which is reset by one of said address transition detection signals and is set by an output of said waveshaping circuit.

9. The device as set forth in claim 6, wherein a third one of said timing generating circuits comprises:

a plurality of inverters arranged in series; and a sixth logic circuit connected to a number of said inverters.

* * * * *